(12) United States Patent
Remnas et al.

(10) Patent No.: US 9,341,652 B2
(45) Date of Patent: May 17, 2016

(54) ELECTRONIC LOAD MODULE AND A METHOD AND A SYSTEM THEREFOR

(71) Applicant: Telefonaktiebolaget L M Ericsson (PUBL), Stockholm (SE)

(72) Inventors: Kjell-Arne Remnas, Hindas (SE); Per Forsberg, Savedalen (SE); Bjorn Isaksson, Gothenburg (SE); Lukas Rosen, Gothenburg (SE); Sahar Samimi, Gothenburg (SE)

(73) Assignee: TELEFONAKTIEBOLAGET LM ERICSSON (PUBL), Stockholm (SE)

( * ) Notice: Subject to any disclaimer, the term of this patent is extended or adjusted under 35 U.S.C. 154(b) by 325 days.

(21) Appl. No.: 13/809,749

(22) PCT Filed: Dec. 21, 2012

(86) PCT No.: PCT/EP2012/076781
§ 371 (c)(1),
(2) Date: Mar. 28, 2013

(87) PCT Pub. No.: WO2014/094901
PCT Pub. Date: Jun. 26, 2014

(65) Prior Publication Data
US 2014/0176166 A1 Jun. 26, 2014

(51) Int. Cl.
*G01R 31/40* (2014.01)
*G01R 1/44* (2006.01)
(52) U.S. Cl.
CPC . *G01R 1/44* (2013.01); *G01R 31/40* (2013.01)
(58) Field of Classification Search
CPC .................................................. G01R 31/2874
See application file for complete search history.

(56) References Cited

U.S. PATENT DOCUMENTS

| 5,406,212 | A | * | 4/1995 | Hashinaga et al. | ...... 324/750.07 |
|---|---|---|---|---|---|
| 2005/0268189 | A1 | * | 12/2005 | Soltis | ............ 714/724 |
| 2009/0058454 | A1 | * | 3/2009 | An et al. | ........ 324/765 |
| 2011/0211351 | A1 | * | 9/2011 | Van De Ven et al. | .... 362/249.02 |
| 2012/0161779 | A1 | | 6/2012 | Shiau et al. | |
| 2013/0181736 | A1 | * | 7/2013 | Gostein et al. | ........ 324/761.01 |

FOREIGN PATENT DOCUMENTS

JP 2011117790 A 6/2011

OTHER PUBLICATIONS

International Search Report of the International Searching Authority, issued on Sep. 6, 2013, in corresponding international application No. PCT/EP2012/076781, 4 pages.
Written Opinion of the International Searching Authority, issued on Sep. 6, 2013, in corresponding international application No. PCT/EP2012/076781, 6 pages.

* cited by examiner

*Primary Examiner* — Tung X Nguyen
*Assistant Examiner* — Feba Pothen
(74) *Attorney, Agent, or Firm* — Rothwell, Figg, Ernst & Manbeck, P.C.

(57) ABSTRACT

The present invention relates to an electronic load module and to a method and a system therefor. The method comprises receiving control data (301) from a connectable power controller via a data bus connector (202), and controlling (302) an active load (203) based on the received control data to sink a defined current from a connectable device under test via a first input (204). The method further comprises controlling (303) the activate load (203) based on the received control data by means of a digital control circuit (201) and the connectable power controller to generate and maintain an ambient temperature of the device under test.

10 Claims, 4 Drawing Sheets

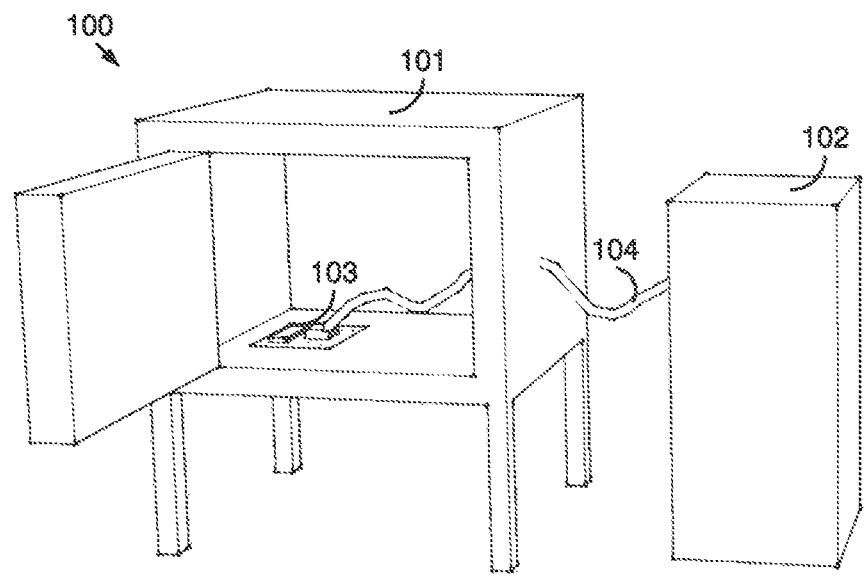
Fig. 1 Prior-art
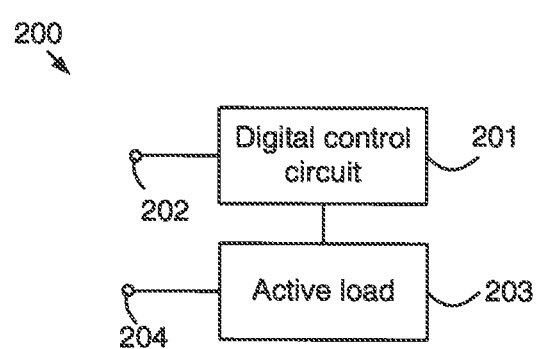
Fig. 2

US 9,341,652 B2

ELECTRONIC LOAD MODULE AND A METHOD AND A SYSTEM THEREFOR

CROSS REFERENCE TO RELATED APPLICATION(S)

This application is a 35 U.S.C. §371 National Phase Entry Application from PCT/EP2012/076781, filed Dec. 21, 2012, designating the United States, the disclosure of which is incorporated herein in its entirety by reference.

TECHNICAL FIELD

The present disclosure relates to an electronic load, and more particularly to an electronic load module configured for testing power supply systems on a printed board assembly as well as a method and a system therefor.

BACKGROUND

Modern integrated circuits, IC, consume more and more power at lower supply voltages. Therefore, the traditional approach of delivering converted power from a power supply unit (PSU) at the right voltage to the IC on a printed circuit board (PCB) via a connector on the PCB is no longer a viable solution. This can easily be understood by simple calculations using ohms law: an IC with a supply voltage of 2.2 V and a power consumption of 30 W requires a current of approximately 13 A. A PSU with such ratings exhibits large ohmic losses due to the resistance of the leads from the PSU to the IC.

A common solution to this problem is to place the PSU close to the IC on the PCB and to utilize an intermediate bus voltage provided to the PSU on the PCB via a connector. It is also common today to integrate a power controller on the PCB that controls all PSU's with a dedicated bus, such as a PMBUS for example.

This results in PCB's comprising several intertwined subsystems related to different functions of the circuit. One critical subsystem is the power supply system. The power supply system must provide large power consumers, such as a field programmable gate array (FPGA) circuit, with stable power at low supply voltage and high current. Especially the phase of turning on a FPGA circuit proves to be very demanding for the PSU since it is usually recommended to ramp-up the supply voltage in a controlled manner.

During the development of a modern PCB it is frequently desired to test each subsystem separately before integrating the full system on the PCB. Hence, in order to test the PSU system on the PCB an electronic load is needed to replace the current consuming subcircuits such as the FPGA circuit.

Such an electronic load is commonly available as benchtop equipment and rack mounted devices connected to the PCB by means of leads and connectors.

Another aspect to test is the effect of the environment on the PCB, and especially temperature effects on the stability and functionality of the power supply system on the PCB.

This environmental test is usually performed in an environmental test chamber, see FIG. 1. Such an environmental test is performed by placing the PCB in the chamber with the electric load connected to the power supply system. The temperature in the chamber is gradually increased until the desired working temperature is reached. Then the electrical test of the power supply system is performed by turning on the power supply system and variate the electrical load to simulate different working conditions.

Some problems exists with this setup. First, the environmental test chamber is usually quite expensive and bulky. Secondly, the leads connecting the electronic load to the PCB are usually long and cause parasitic inductances and capacitances between the electronic load and the PCB. Such parasitic effects makes it difficult to correctly simulate slew-rate effects on the PCB by means of the electronic load.

SUMMARY

An object is therefore to address the problems and disadvantages outlined above, and to provide an improved electronic load module as well as a system and a method.

This object and others are achieved by the method, the electronic load module and the system according to the independent claims, and by the embodiments according to the dependent claims.

In accordance with one embodiment a method for operating an electronic load module is provided. The electronic load module comprises a digital control circuit configured to be connected to a power controller via a data bus connector, an active load operatively connected to and controlled by said digital control circuit and a first input operatively connected to the active load and configured to be connected to a device under test. The method comprises receiving control data from said connectable power controller via the data bus connector, and controlling the active load based on the received control data to sink a defined current from said connectable device under test via the first input. The method also comprises controlling the activate load based on the received control data by means of the digital control circuit and the connectable power controller to generate and maintain an ambient temperature of the device under test.

In accordance with another embodiment, an electronic load module is provided. The electronic load module comprises a digital control circuit configured to be connected to a power controller via a data bus connector, an active load operatively connected to and controlled by said digital control circuit, and a first input operatively connected to the active load and configured to be connected to a device under test. The digital control circuit is configured to receive control data from said connectable power controller via the data bus connector. The digital control circuit is further configured to control the active load to sink a defined current from said device under test via the first input. The activate load of the electronic load module is configured to be controlled by said digital control circuit to generate and maintain an ambient temperature of the connectable device under test.

In accordance with yet another embodiment a system for electrical loading of a device under test is provided. The system comprises a power controller configured to control at least one power converter circuit within the device under test, a physical housing of the device under test, and a temperature sensor operatively connected to said power controller and being configured to measure an ambient temperature inside said physical housing. The system further comprises an electronic load module configured to be controlled by said power controller and being configured to be arranged within the device under test. The electronic load module comprises an active load configured to sink a current from said device under test. The electronic load module of the system is configured to generate and maintain a defined ambient temperature within the physical housing of the device under test using the active load, and the power controller is configured to control the ambient temperature within the physical housing based on said measured temperature and by means of the electronic load module.

An advantage of particular embodiments is that the conventional environmental test chamber becomes unnecessary.

BRIEF DESCRIPTION OF THE DRAWINGS

FIG. 1 is a schematic drawing of a conventional setup of a load test system.

FIG. 2 is a schematic block diagram of an inventive electronic load module.

DETAILED DESCRIPTION

Figure 3:
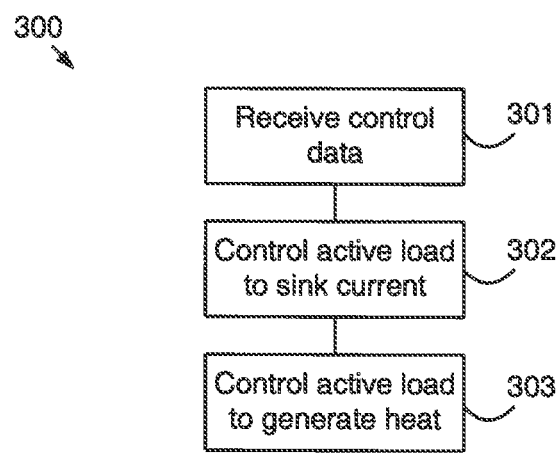
FIG. 3 is a flowchart of the method performed by the electronic load module of FIG. 2.

In the following, different aspects will be described in more detail with references to certain embodiment and to the accompanying drawings. For purposes of explanation and without intention of limitation, specific details are set forth, such as particular scenarios and techniques, in order to provide a thorough understanding of the different embodiments. However, other embodiments that depart from these specific details may also exist.

FIG. 1 is a schematic drawing of a conventional measurement set up, generally designated 100, for performing measurements at elevated temperatures. This setup comprises an environmental test chamber 101 that can control the temperature inside the same. Inside the environmental test chamber 101 is a device under test (DUT) 103 arranged. The DUT 103 can be a PCB or a complete device with an internal PSU. To test the PSU of the DUT it is suitable to connect an electronic load 102 to the PSU. In order to connect the electronic load 102 to the DUT 103 leads 104 are arranged there between. These leads 104 are usually relatively thick in order to minimize the impact of ohmic losses.

A severe drawback of this system is the parasitic inductances and capacitances caused by the long leads 104. These parasitic components make it very hard to perform precise slew-rate measurements on the DUT 103.

Another drawback is related to the measurement setup itself. By arranging the electronic load 102 separated from the DUT 103 local heating effects in the DUT 103 is not captured during the measurement.

Therefore, it would be beneficial if these drawbacks could be obviated.

This disclosure describes a feasible way to overcome the shortcomings of the conventional setup system 100.

Generally, a modern electronic circuit on a PCB often comprises some circuits that have huge power demands at low supply voltages. Such a circuit might be a Field Programmable Gate Array (FPGA). In order to fulfill the power need from the FPGA the PCB often includes several point of load (POL) voltage converters. These POL regulators are usually connected to a power controller via a dedicated bus, such as a power management bus (PMBUS). The power controller is configured to control each of the POL regulators via said dedicated bus.

FIG. 2 is a schematic block diagram of an embodiment of an electronic load module, generally designated 200. The electronic load module 200 comprises a digital control circuit 201 configured to be connected to the power controller mentioned above via a data bus connector 202. The digital control circuit 201 is further connected to an active load 203. The active load 203 further comprises a first input 204 configured to be connected to a OUT. The active load 203 is configured to sink a defined current from the first input 204 to ground potential and to generate and maintain an ambient temperature of the connectable OUT. The control of the active load 203 to sink the defined current or to generate heat, respectively, is performed by the digital control circuit 201 and the connectable power controller.

The control of the electronic load module is performed according to a method disclosed in the flowchart in FIG. 3. The method 300 comprises:

301: Receive control data from the connectable power controller via the data bus connector 204. This control data may comprise defined set temperatures and defined set currents.

302: Control the active load to sink a defined current from said connectable DUT via the first input 204.

303: Control the active load by means of the digital control circuit and the connectable power controller to generate and maintain the ambient temperature of the DUT. This step of the method uses the active load as a heating device for providing the necessary heat in order to bring the OUT to the defined temperature.

In one embodiment, the electronic load module 200 may be arranged to replace a FPGA on a PCB during a test phase. The electronic load module 200 may be in thermal contact with a heat sink provided for the FPGA.

Figure 4:
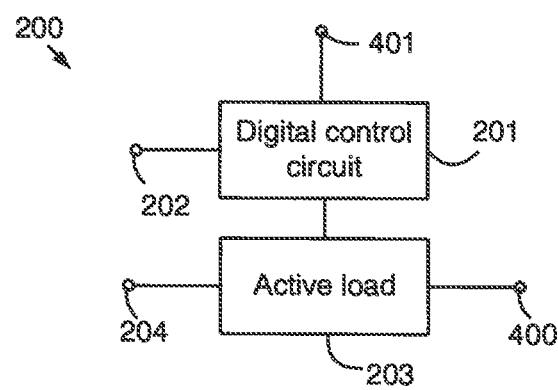
FIG. 4 is a schematic block diagram of an electronic load module with a second input and a computer interface.

In FIG. 4 another embodiment of the electronic load module 200 is disclosed. In this embodiment is the digital control circuit provided with a computer interface 401 that is configured to be connected to an external computer. This computer interface may be used to reprogram the digital control circuit 201. In one embodiment the computer interface is a JTAG interface.

In one embodiment comprises the active load 203 a second input 400 configured for supplying the active load 203 with external power from an external power supply for the purpose of heating.

Figure 5:
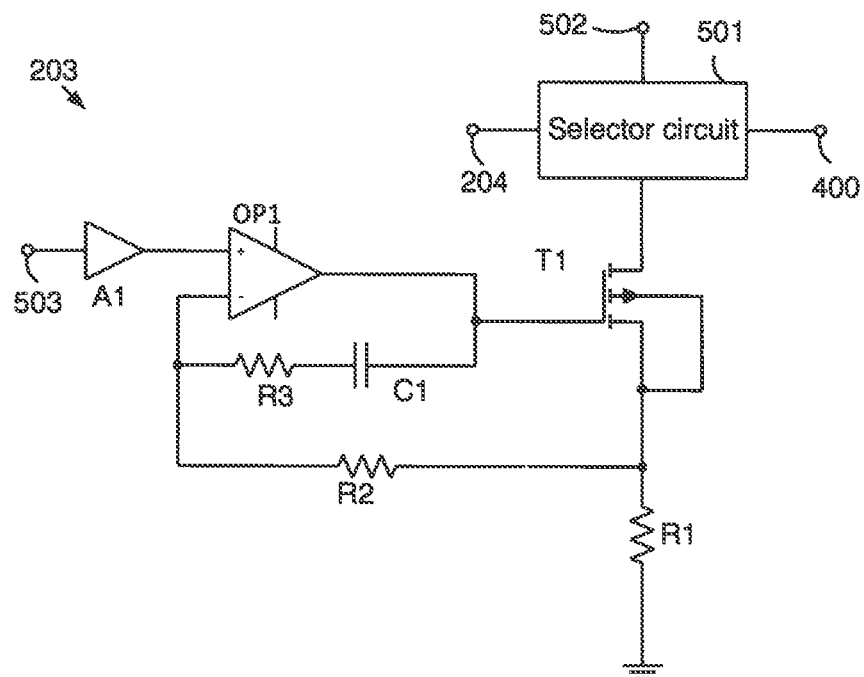
FIG. 5 is a schematic block circuit diagram of an active load of the electronic load module.

An embodiment of an active load 203 will now be disclosed with reference made to FIG. 5. The active load 203 comprises said selector circuit 501 with the first input 204 configured to be connected to a DUT. The second input 400 of the active load 203 is configured to be connected to an external power supply for heating purposes. The selector circuit further comprises a select input 502 configured to receive a select signal from the digital control circuit 201.

The active load further comprises a control input 503 configured for receiving an analog control signal from the digital control circuit 201. This analog control signal from the digital control circuit 201 may be generated by a digital to analog converter of the digital control circuit 201.

The active load 203 further comprises a MOSFET transistor T1 with the drain thereof connected to an output of said selector circuit 501, and the source being connected to ground potential via a first resistor R1.

The active load 203 further comprises an operational amplifier OP1 having the non-inverting input connected to the output of a buffer amplifier A1. The input of the buffer amplifier A1 is configured to be connected to said digital control circuit 201 via said control input 503, the inverting input of the operational amplifier OP1 being connected to the source of the MOSFET transistor via a second resistor R2 forming a feedback loop, and the output of the operational amplifier OP1 is connected to the inverting input of the operational amplifier OP1 via a third resistor R3 and a first capacitor C1. The output of the operational amplifier OP1 is further connected to the gate of the MOSFET transistor T1.

The operation of the active load 203 will now be described with reference made to FIG. 5 using a first scenario and a second scenario.

In the first scenario the first input 204 is selected by said select signal from the digital control circuit 201. By applying a control voltage to the control input 503 the buffer amplifier A1 applies the control voltage to the non-inverting input of the operational amplifier OP1. Due to the first feedback branch the operational amplifier will adjust its output voltage in order to achieve zero voltage offset between the non-inverting input and the inverting input of the operational amplifier OP1. Hence, the MOSFET transistor will be activated by means of the voltage potential of the gate thereof caused by the output of the operational amplifier OP1 causing a current through the first resistor R1. The current through the first resistor R1 causes a voltage drop over the first resistor R1. This voltage drop is fed back to the inverting input of the operational amplifier OP1. In this first scenario the current through the first resistor R1 is controlled by means of the control voltage at the control input 503.

In the second scenario the second input 400 is selected by said select signal from the digital control circuit 201. The second input 400 is configured to be connected to the external power supply. In this second scenario, the purpose of connecting an external power supply is to use the MOSFET transistor to dissipate heat by flowing a current through the same. In this scenario the control voltage at the control input 503 is used to control the amount of heat that the MOSFET transistor dissipates.

Figure 6:
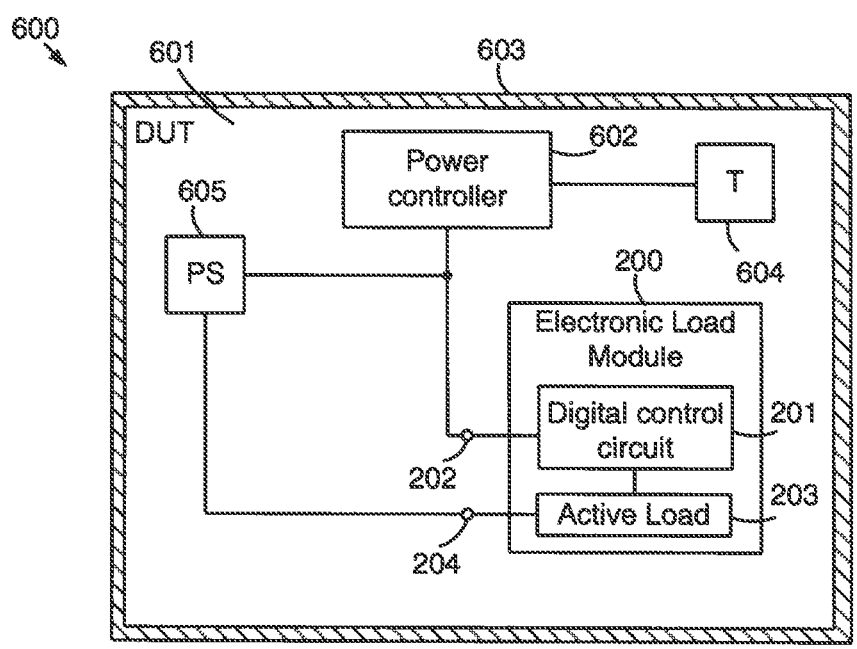
FIG. 6 is a schematic block diagram of an electronic load system incorporating the electronic load module of FIG. 5.

FIG. 6 is a schematic block diagram of an embodiment of a system 600 for electrical loading of a DUT 601. The system 600 comprises a power controller 602 configured to control at least one power converter circuit 605 within the DUT 601, and a physical housing 603 of the DUT 601. This housing 603 is used to shield the DUT 601 from the surrounding environment. This housing could also be a RF shield.

The system 600 further comprises a temperature sensor 604 operatively connected to said power controller 602 and being configured to measure a temperature inside said physical housing 603.

The system 600 further comprises an electronic load module 200 configured to be controlled by said power controller 602 and being configured to be arranged within the DUT 601. The electronic load module 200 comprises an active load 203 configured to sink a current from said DUT 601

The electronic load module 200 is configured to generate and maintain a defined temperature within the housing 603 of the DUT 601 using the active load 203. The power controller 602 is configured to control the temperature within the physical housing 603 based on said measured temperature by means of the electronic load module 200.

Figure 7:
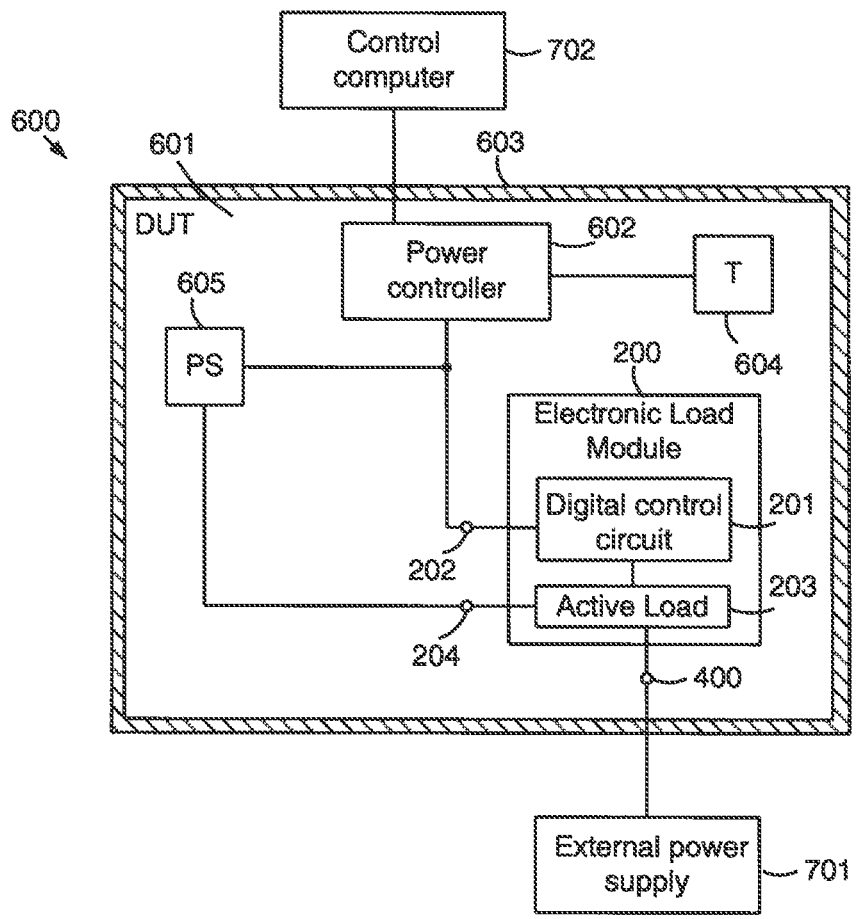
FIG. 7 is a schematic block diagram of an alternative electronic load system.

Another embodiment of a system for electrical loading of a DUT is now disclosed with reference to FIG. 7. In this embodiment an external power supply 701 is connected to the second input 400 of the active load 203. This external power supply may be used to generate heat and to maintain the temperature within said housing 603. The whole test sequence is controlled and supervised via a control computer 702. The control computer 702 is operatively connected to the power controller 602 by means of for example a computer bus such as a PMBUS.

The operation of this system can shortly be described as: measure the ambient temperature within the DUT 601 with the temperature sensor 604 and send the temperature data to the control computer 702. If it is determined by the control computer 702 that the temperature must be increased, a command is sent from the control computer 702 via the power controller 602 to the electronic load module 200. The digital control circuit 201 of the electronic load module 200 selects the second input 400 as an input source. Hence, the DUT 601 is disconnected from the electronic load module 200 by means of the selector circuit 501. The active load 203 is then used to generate heat within the DUT 601 and the housing 603. This heating is supervised and controlled by the power controller 602 and the control computer 702. When the defined ambient temperature within the DUT 601 is reached, the external power supply is disconnected. At this point the DUT 601 is ready for testing by means of the electronic load module 200. A test program emulating different loading conditions is then executed by the control computer 702 and performed by the electronic load module 200. If it is determined that the DUT 601 needs some extra heating during the test sequence, the external power supply is then temporarily connected and used to heat the DUT 601.

In one embodiment is the electronic load module 200 configured to be pin compatible with a circuit in the DUT and to use existing heatsinks within the DUT to dissipate heat. In this way realistic temperature distributions within the DUT 601 can be achieved.

Such a mounting of the electronic load module within the DUT 601 also enables realistic slew-rate tests. That may emulate the power-on sequence for a FPGA circuit. This can be attributed to the fact that long leads connecting a DUT to the electronic load is eliminated, or significantly reduced, resulting in a minimization of the parasitic elements.

In order to further illustrate the beneficial features of the system some exemplary scenarios will now be disclosed.

In the first exemplary scenario a PCB comprising a FPGA circuit will be described. The DUT 601 in this first exemplary scenario is a PCB with functions relating to a telecommunication system. The physical housing 603 of this DUT 601 is provided for RF shielding. In order to have sufficient power for the FPGA circuit a modern distributed PSS is utilized. This PSS comprises a power controller 602 operatively connected to several POL converters by means of a PMBUS. The designers of this PCB wants to test the capabilities of the PSS under different working conditions, unfortunately the FPGA sub-circuit is not ready for testing at this early stage of development. It is therefore desired to emulate the loading by the FPGA on the PSS by means of the electronic load module 200. The electronic load module is configured to be pin compatible with the FPGA circuit, and therefore the electronic load module 200 is a drop-in replacement for the FPGA circuit. The MOSFET T1 of the active load 203 is configured to be thermally connected to the heatsink of the FPGA. The electronic load module 200 is further configured to be controlled by Instructions received from the PMBUS via the data bus connector 202. In this way no extra control leads are needed to control the electronic load module. The control computer 702 is connected to the power controller via a USB to PMBUS converter.

In this scenario no environmental test chamber is required and no long leads are required to connect the electronic load module 200 to the PCB. Hence, a very realistic test of the DUT is possible including the demanding slew-rate measurements.

In a second exemplary embodiment several active loads 203 are connected to the digital control circuit 201. Accordingly, the electronic load module can generate heat and sink current simultaneously.

The above mentioned and described embodiments are given only as examples and should not be limiting to the present invention.

ABBREVIATIONS

DUT Device Under Test
FPGA Field Programmable Gate Array
JTAG Joint Test Acton Group
PCB Printed Circuit Board
PMBUS Power Management BUS
POL Point Of Load
PSS Power Supply System
PSU Power Supply Unit

The invention claimed is:

1. A method for operating an electronic load module, wherein the electronic load module comprises:
   a digital control circuit configured to be connected to a power controller via a data bus connector;
   an active load operatively connected to and controlled by said digital control circuit; and
   a first input operatively connected to the active load and configured to be connected to a device under test;
   wherein the method comprises:
   receiving control data from said connectable power controller via the data bus connector;
   controlling the active load based on the received control data using the digital control circuit and the connectable power controller to generate and maintain an ambient temperature of the device under test and to sink a defined current from said connectable device under test via the first input.

2. The method according to claim 1, wherein the electronic load module comprises a second input connected to said active load and being configured to be connected to an external power supply, wherein said active load is configured to be controlled by the digital control circuit to select the first input or the second input for receiving power, wherein the method further comprises:
   controlling the active load based on the received control data to receive power from said second input causing the active load to produce heat by using said connectable external power supply.

3. The method according to claim 1, wherein the electronic load module further comprises a computer interface connected to said digital control circuit and being configured to be connected to an external computer, wherein the method further comprises reprogramming the digital control circuit by said external computer via said computer interface.

4. An electronic load module comprising:
   a digital control circuit configured to be connected to a power controller via a data bus connector;
   an active load operatively connected to and controlled by said digital control circuit; and
   a first input operatively connected to the active load and configured to be connected to a device under test,
   wherein the digital control circuit is configured to receive control data from said connectable power controller via the data bus connector and to control the active load, based on the received control data, to sink a defined current from said device under test via the first input, wherein the active load is configured to be controlled by said digital control circuit, based on the received control data, to generate and maintain an ambient temperature of the connectable device under test.

5. The electronic load module according to claim 4, comprising a second input being connected to a selector circuit of said active load and configured to be connected to an external power supply, wherein the selector circuit is configured to selectively provide power from either the connectable device under test or the connectable external power supply to the active load.

6. The electronic load module according to claim 5, wherein said active load comprises:
   said selector circuit being connected to the first input and to the second input;
   a MOSFET transistor with the drain thereof connected to an output of said selector circuit, and the source being connected to ground potential via a first resistor;
   an operational amplifier having the non-inverting input connected to the output of a buffer amplifier, the input of the buffer amplifier is configured to be connected to said digital control circuit via a control input, the inverting input of the operational amplifier is connected to the source of the MOSFET transistor via a second resistor forming a feedback loop, and the output of the operational amplifier is connected to the inverting input of the operational amplifier via a branch comprising a third resistor and a first capacitor, the output of the operational amplifier is further connected to the gate of the MOSFET transistor;
   whereby the current through the MOSFET transistor is controlled by said digital control circuit, and by controlling the selector circuit can the connectable external power supply be selected to supply power to said MOSFET transistor for generating heat.

7. The electronic load module according to claim 4, comprising a computer interface connected to said digital control circuit and being configured to be connected to an external computer, wherein the digital control circuit can be reprogrammed by said external computer via said computer interface.

8. A system for electrical loading of a device under test, wherein the system comprises:
   a power controller configured to control at least one power converter circuit within the device under test;
   a physical housing of the device under test;
   a temperature sensor operatively connected to said power controller and being configured to measure an ambient temperature inside said physical housing;
   an electronic load module configured to be controlled by said power controller and being configured to be arranged within the device under test, wherein the electronic load module comprises an active load and a digital control circuit configured to receive control data from the power controller and to control the active load, based on the received control data, to sink a defined current from said device under test,
   and wherein the electronic load module is configured to generate and maintain a defined ambient temperature within the physical housing of the device under test using the active load, which is controlled by the digital control circuit based on the received control data, and
   the power controller is configured to control the ambient temperature within the physical housing based on said measured ambient temperature and by the electronic load module.

9. The system according to claim 8, comprising an external power supply, and wherein the electronic load module comprises a second input for receiving power from the external power supply, the electronic load module is further configured to select either the device under test or the external power supply for sinking current and generating heat, respectively.

10. The system according to claim 8, comprising a control computer operatively connected to said power controller and being configured for communication with the power controller, wherein the communication comprises sending instructions about said defined temperature within the physical housing and loading instructions.

* * * * *